United States Patent
Kirschner

(10) Patent No.: US 6,388,497 B1
(45) Date of Patent: *May 14, 2002

(54) CIRCUIT ARRANGEMENT AND METHOD FOR MAINTAINING CONTROL OF A PERIPHERAL DEVICE BY A CONTROLLER DURING A CONTROLLER

(75) Inventor: Manfred Kirschner, Stuttgart (DE)

(73) Assignee: Robert Bosch GmbH, Stuggart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/438,654

(22) Filed: Nov. 12, 1999

(30) Foreign Application Priority Data

Nov. 30, 1998 (DE) .......................... 198 55 143

(51) Int. Cl.$^7$ ................................. H03L 5/00
(52) U.S. Cl. ...................... 327/332; 327/172
(58) Field of Search ............... 327/103, 104, 327/129, 143, 185, 189, 172, 176, 198, 332; 336/69, 291, 293

(56) References Cited

U.S. PATENT DOCUMENTS

| 3,805,178 | A | * | 4/1974 | Rollett ..................... 330/107 |
| 4,017,056 | A | | 4/1977 | Schwalenstocker et al. 251/131 |
| 4,587,939 | A | | 5/1986 | Hemminger et al. ......... 123/479 |
| 4,890,004 | A | * | 12/1989 | Beckerman ................. 307/66 |
| 5,635,871 | A | * | 6/1997 | Cavigelli .................... 330/107 |
| 5,815,037 | A | * | 9/1998 | Tomasini et al. ............ 330/69 |
| 5,850,156 | A | * | 12/1998 | Wittman .................... 327/143 |
| 5,867,048 | A | * | 2/1999 | Chou ........................ 327/174 |

FOREIGN PATENT DOCUMENTS

| DE | 40 23 700 A1 | 1/1992 |
| DE | 197 20 191 C1 | 4/1998 |
| JP | 63-17145 | 1/1988 |

* cited by examiner

*Primary Examiner*—Toan Tran
*Assistant Examiner*—Quan Tra
(74) *Attorney, Agent, or Firm*—Michael J. Striker

(57) ABSTRACT

The method and circuit arrangement and/or component prevents a change of a preset or set state of a control member and/or control unit (102) during a reset of controller or regulator (100) that controls this control member and/or control unit. The circuit arrangement and/or component (101) has at least one input and at least one output (TA) and is connected between at least one terminal (P) of a controller or regulator (100) and at least one input of the control member and/or control unit (102, 104). The at least one output (TA) of the circuit arrangement and/or component is connected for feedback to the at least one terminal (P) of the controller or regulator (100) and/or the at least one input of the circuit arrangement and/or the component (101), e.g. by means of feedback element (105), which may be a feedback resistor.

17 Claims, 3 Drawing Sheets

CIRCUIT ARRANGEMENT AND METHOD FOR MAINTAINING CONTROL OF A PERIPHERAL DEVICE BY A CONTROLLER DURING A CONTROLLER

BACKGROUND OF THE INVENTION

1. Field of the Invention

The present invention relates to a circuit arrangement or a circuit means, especially a chip or component, with at least one input and at least one output, that is connected between at least one terminal of a controller or regulator, especially a microprocessor, and at least one input of an adjusting member and/or control unit to prevent a change of a preset state of the adjusting member and/or control unit during resetting of the controller or regulator, especially the microprocessor. It also relates to a method of maintaining or preventing a change of a set state of an adjusting member and/or control unit during a reset of the controller or regulator by means of a first signal controlling the controller or regulator.

2. Related Art

A buffer circuit for the output of a microprocessor is described in German Patent Document DE 197 20 191 C1. A buffer circuit is connected between an input and output of the microprocessor and an adjusting member. The buffer circuit has a comparator circuit whose input is connected to the output of the microprocessor. The comparator circuit switches between a high level and a low level that is applied to the adjusting member when a predetermined voltage level is reached at the input of the comparator circuit. The comparative circuit is preferably a Schmitt trigger. Moreover the buffer circuit includes an energy reservoir with which the input of the comparator circuit is buffered. This energy reservoir is preferably embodied as a capacitor connected parallel to the input of the comparator. The time constant of the capacitor is selected so that the voltage level during a normal voltage interruption of the power supply occurring during a starting process or an interruption of the voltage supply from the power supply does not reach the set value of the comparator circuit. Thus the momentary state of an adjusting element controlled by the microprocessor is preserved when there is an interruption in the voltage and a reset is triggered.

An additional example of this sort of circuit arrangement is described in German Patent Document DE 40 23 700 A1. The disclosed circuit for monitoring the frequency of a signal from a microprocessor contains a frequency generator, which produces a cyclic error or reset signal, when the input signal sequence has a frequency that is outside of a predetermined frequency variation range. Furthermore this circuit arrangement comprises a voltage monitoring circuit, which blocks the so-called reset or error signals from the frequency generator to the microprocessor in the presence of an unreliable operating voltage. Furthermore an error signal supplying device is described in this paper that generates a static error signal. This error signal acts as a switching signal for the frequency generator and/or as a lock-in signal for a end stage which is associated with the microprocessor.

The above-mentioned circuit arrangement is activated when an interruption or a too rapid increase in the supply voltage occurs. Thus only reset situations, which are triggered by an overvoltage or undervoltage, are considered. Other factors, such as a processor overload or an access error that activate a reset, do not activate this circuit.

Besides by switching a lock-in signal applied to the end stage that is associated with the microprocessor, only an already established state can be given, but a previously active state set up earlier in the end stage state and desired now cannot be activated.

Buffering by an energy reservoir, such as a capacitor acts only for a predetermined time interval, namely the discharge time of the capacitor, so that the state of the end stage thus cannot be maintained independently of time considerations for that reason.

The current circuitry thus operates with either a charging or discharging time constant or a timing device or a previously active state cannot be maintained at the following end stage, although a currently fixed state can be maintained.

Furthermore a flip-flop with following end stage is known for maintaining a state. Also two I/O ports of a microprocessor are required. The state to be maintained is stored in a non-volatile memory. When a reset occurs in the microprocessor the momentary state is stored. A readout of this state is also possible by a third I/O port.

An increased circuitry expense is required because of these features. Furthermore a number of I/O ports of the microprocessor are occupied by the required circuitry.

SUMMARY OF THE INVENTION

It is an object of the present invention to provide an improved circuit arrangement or device, by which a state of an adjusting device or control unit is maintained despite an arbitrarily-caused reset of the controller or regulator controlling the adjusting device or control unit.

It is also an object of the present invention to provide a simple circuit arrangement or device and/or a simple chip or component and method, which switch an occupied I/O port for an element to be controlled, whereby the circuit device or the component operates with a static level, without time limitations, which makes a readout of the state possible.

Furthermore the simple method according to the invention, when it is employed with the above-described circuit arrangement, permits complete implementation in or by means of a processor.

According to the invention the circuit arrangement for preventing a change of a preset state of a control member and/or control unit during resetting a controller or regulator thereof has at least one input and at least one output, the at least one output being connected with at least one input of the control member and/or the control unit and the at least one input of the circuit arrangement being connected with at least one terminal of the controller or regulator. The at least one output of the circuit arrangement is connected for signal feedback to the at least one terminal of the controller or the regulator and/or the at least one input of the circuit arrangement, preferably by means of a filter comprising a resistive and reactive element.

The circuit arrangement according to the invention, which is connected between a microprocessor and a peripheral device, operates so that a given peripheral device experiences no state change because of a reset that is triggered either directly by the microprocessor itself or by another integrated circuit. The peripheral device, especially an end stage, is not switched by a reset. If the end stage is switched off, it is not turned on by the reset. The resetting of a controller or adjusting device, especially a microprocessor, is designated as reset in the following. An initialization stage calls up this reset. The circuit arrangement according to the invention guarantees that a reset with subsequent initialization stage of the controller or regulator causes no state change of the peripheral device to be controlled.

Furthermore after turning on the control device, especially in the initialization stage and/or during the power-on-reset, the peripheral device takes a definite, previously given state or maintains a previously set state.

The circuit arrangement according to the invention operates in this manner regardless of the origin of the reset. Thus for example when there is a reset that is triggered because of processor overload or an access error the circuit arrangement according to the invention operates in the claimed manner described above, as it does when the reset is caused by an undervoltage or overvoltage.

In contrast to the above-named state of the art the circuit arrangement according to the invention operates with a static level, without charging or discharging constants or timing elements.

An additional advantage of the circuit arrangement according to the invention claimed in the main claim appended hereinbelow in comparison to the large scale comparator arrangements described is that the circuit arrangement according to the invention is clearly simpler. Thus considerable cost savings and a greater reliability due to a reduced failure probability result because of the use of a reduced number of components.

The circuit arrangement according to the invention persists in its state until the microprocessor or microcontroller is reset because of the absence of the timing conditions or devices in the circuit arrangement according to the invention, and the active control by means of the operation or the peripheral device is again observed. Because of that feature the state or status of the peripheral element can be readout at any time by means of the same I/O port of the microprocessor.

According to the invention the method for preventing a change of a preset state of a control member and/or control unit during resetting a controller or regulator controlling the control member and/or control unit by means of a first signal includes the steps of:

a) forming a second signal according to the first signal from a first circuit arrangement and/or a first component;

b) controlling the control member and/or control unit with the second signal instead of the first signal; and c) feeding the second signal back to the controller or regulator and/or together with the first signal to the first circuit arrangement and/or the first component.

Alternative embodiments of the method are possible in which a third signal is formed from the second signal and fed together with the first signal directly to the first circuit arrangement and/or first component or in which a fourth signal is formed from the third signal by means of a second component and/or a second circuit arrangement and is fed back to the first circuit arrangement and/or the first component together with the first signal.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 1:
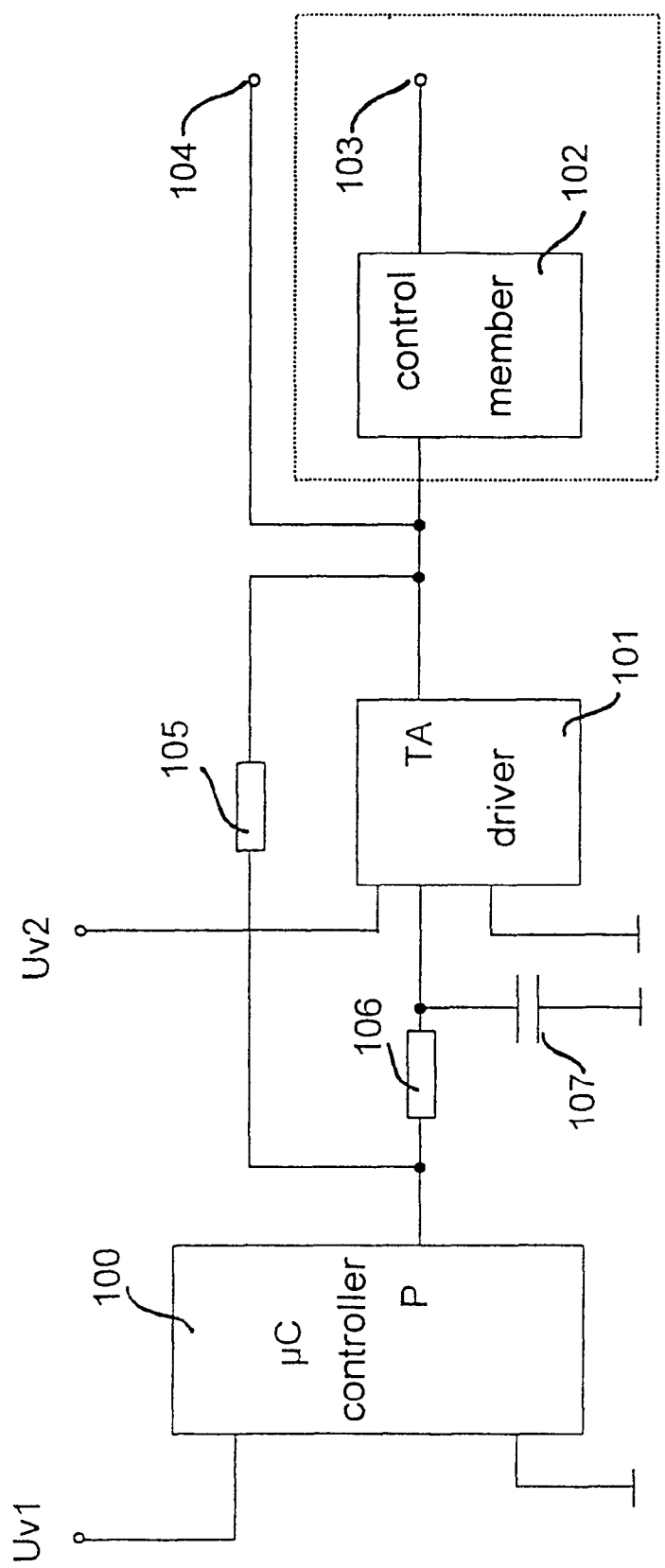
FIG. 1 is a schematic diagram of one embodiment of a circuit arrangement according to the invention with a simple driver component, in which the circuit arrangement is connected between a microprocessor and possible end stages.

FIG. 1 shows a preferred embodiment of the circuit arrangement according to the invention for maintaining the adjusting member and/or peripheral device function after a reset. A supply voltage Uv1 is applied to an input of a microprocessor 100. A RC circuit portion comprising a resistor 106 and a capacitor 107 is connected to this microprocessor 100 following it. The RC circuit portion is also connected to a following simple driver component 101. A supply voltage Uv2 is provided to the driver component 101. The supply voltage Uv2 can be either from the same source as Uv1, derived directly from Uv1 or even identical with Uv1, or from another second source of electric power because of safety considerations regarding possible loss of supply voltage.

The driver component 101 can be an operational amplifier or a MOS or CMOS chip. The output TA of the simple driver component 101 can be connected with a peripheral device 102, for example an inverting end stage with an open collector, whose output leads to a control unit pin 103. Since the end stage output and thus the end stage is only optional, the output of the driver component 101 can also be used directly for further circuitry by means of the tap 104. A sort of multivibrator or flip-flop circuit that can be set and reset by the μC port P results from feedback from the output from the driver component TA via the resistor 105. The resistor 105 used for the feedback has such a high impedance that the port P of the microprocessor 100 can change the level by active low or active high. An intentional active state change, for example of end stage 102, is triggered by means of the different levels (Active low, Active high). The port P thus in this embodiment requires only a current of ±2 mA to change the state of the end stage, with a feedback resistance of, for example, 2 kΩ, a system based, e.g., on a voltage of 5 V and a circuit threshold resulting from that of e.g. 1.5 to 3.5 V. On resetting the microprocessor 100 or another integrated circuit the microprocessor output or μC port P has a weak pull-up of, for example, at maximum 100 μA. Thus with the driver component in a low state, i.e. when a low level is applied to the driver component, only one voltage of, for example 200 mV, can be reached in this case. This is not sufficient in order to switch the driver component 101 from a low state to a high state. The reverse however is true with the high state of the driver, i.e. with the higher level set, this state is stored or maintained. An illustration of these steps or features of the process is shown later in the signal plan in FIG. 2.

A definite level after switching is guaranteed by the RC circuit portion 106,107 between the microprocessor 100 and the driver component 101. Besides the RC circuit portion operates to reliably suppress high frequency interfering signals, based on its low pass function. In the circuit diagram in FIG. 1 the selected level is designed to be low level, since the capacitor 107 of the RC circuit portion is grounded. Alternatively the capacitor can however be connected to a supply voltage (e.g. Uv1, Uv2), wherein the switched-on state corresponds to a high level. Preferably the RC circuit portion 106,107 is dimensioned so that the calculated time constant is larger than the voltage rise time. This can be achieved, for example, with a resistor 106 having a resistance of 20 kΩ and a capacitor 107 having a capacitance of 100 nF with a voltage rise time of a millisecond.

Figure 2:
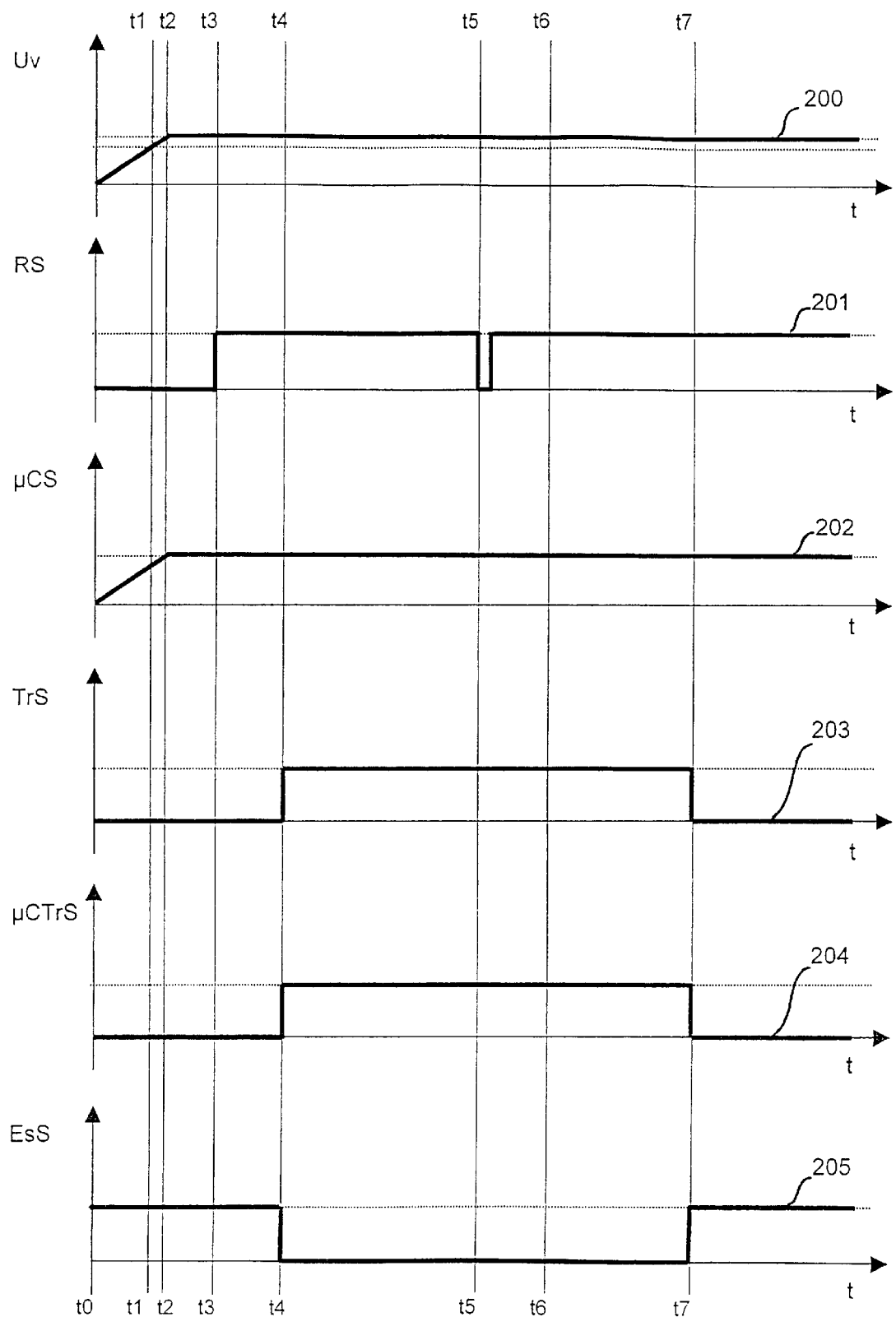
FIG. 2 is a graphical illustration of the essential signals of this type of circuit arrangement in a signal plan.

A detailed illustration of the form of the various signals in the circuit is shown in FIG. 2. The signal trace 200 shows the dependence of supply voltage Uv (e.g. Uv1 and/or Uv2) on time. The signal trace 201 shows the dependence of the reset signal RS on time. The signal trace 202 shows the variation of a signal μCS at the microprocessor output or μC port P without external circuitry with time. The signal trace 203 shows the time variation of a signal TrS at the output TA of the multivibrator or flip-flop, especially here the simple driver component 101. The signal trace 204 shows the dependence of a signal μCTrS at the output of the microprocessor or μC port P with a circuit according to the invention connected to it. The signal trace 205 shows the behavior of an end stage signal EsS, especially a drain potential, in an end stage transistor. The signal trace 200 of the supply voltage Uv climbs continuously from the time t0 to t2. Its initial value is 0 volts in a 5 volt based system and its value at t2 is 5 volts. At t2 the normal level of the supply voltage Uv is reached and is maintained, as long as an interruption or impermissible increase in the supply voltage does not occur.

A reset activated by an impermissible operating voltage is not explicitly illustrated, however the process according to the invention would act like the activation of a reset in the example described in detail in the following description.

After a rapid voltage rise at t0 prior to reaching the voltage value at t2 from t1 the circuit trigger threshold for the microprocessor 100 is reached and the so-called power-on-time runs from t1 to t3 with the so-called power-on-reset as shown on signal trace 201 (RS). The initialization phase of the microprocessor 100 starts at t3 and lasts until t4. After termination of the power-on-reset (t3) and the initialization at time t4 the driver output signal TrS shown as signal trace 203 and the total signal from the microprocessor connected to circuitry μCTrS shown as signal trace 204 are at high level. In the special example of an inverting end stage with open collector the drain potential of the associated transistor EsS is low, based on a previous effective high level above load. The microprocessor signal output is high or the signal μCS (signal trace 202) at that output is at a high potential from t0 up to the time t2, considering the behavior of the signals. Generally this high potential corresponds to a weakly-high-potential until at the termination of the initialization stage at t4. This means that the μC port P is not in a position up to time t4 to switch a following end stage without the circuitry according to the invention. At time t4, after expiration of the weakly-high potential stage the end stage 102, as shown in the signal traces 203, 204 and 205 does switch. From that point on the output of the microprocessor 100 finds itself under software control. If a reset (see signal trace 201, RS) now occurs at time t5 for various arbitrary reasons, for example interference, access loss, unintended operating voltage or processor overload, a switching of the end stage 102 because of this reset at time t5 is avoided by the circuitry according to the invention. The reset signal occurring at t5 triggers a fresh initialization stage with weakly-high-potential up to t6. The signal of the microprocessor port μCS is again in a weakly-high state from time t5 to time t6. A switching of the following end stage 102 based on the weakly-high signal at the microprocessor output or μC port P is thus prevented because of a previous adjustment of the feedback branch. In this special embodiment the common signal μCTrS at the microprocessor output and the feedback loop remain active high because of the resistive feedback (105) of the signal, which is present prior to the initialization triggered by the reset. Thus a so-called weakly-high signal is sufficient to maintain the signals of the microprocessor and the feedback branch μCTrS at an active high level, when they were previously at an active high level. A weakly-high signal, as for example between t0 and t2 to t4, however is not sufficient to switch the signal μCTrS (signal trace 204) to a high level, when it is already at a low level. After expiration of the initialization stage at t6 the signal for switching the peripheral device, especially the final stage 102, is again under software control. Thus at t7 the desired switching down to active low level and thus the switching off of the end stage can finally be accomplished. Thus a peripheral device, especially an end stage 102, can be turned on and off according to choice. A reset for various arbitrary reasons is not sufficient to change the circuit state, or the output signal TrS of the circuit arrangement according to the invention.

Figure 3:
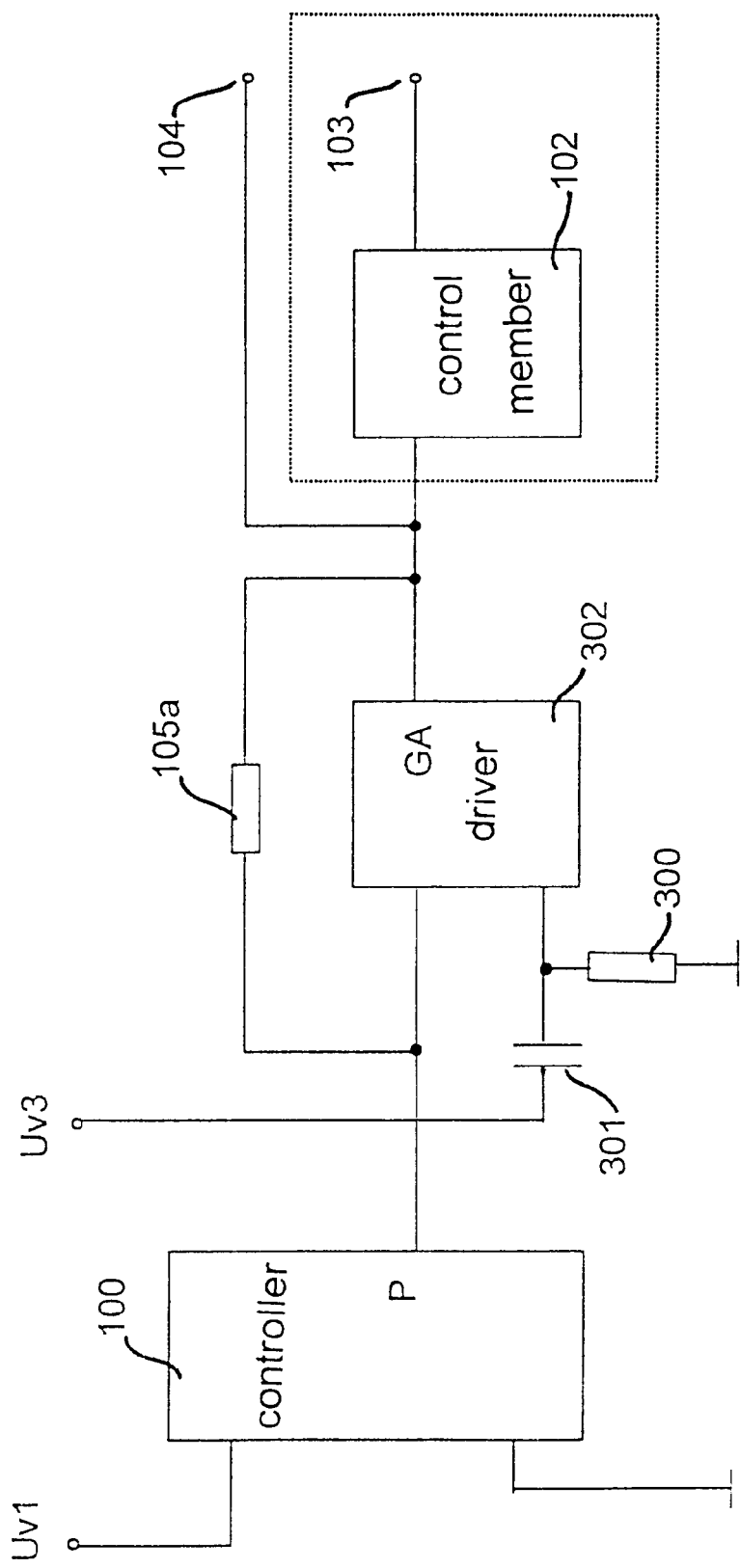
FIG. 3 is a schematic diagram of another embodiment of the circuit arrangement according to the invention, in which the driver component, is replaced for example by a logic component, e.g. an OR gate or an AND gate.

In an additional embodiment of the switching circuit according to the invention shown in FIG. 3 a logic gate is used in place of the previously described driver component 101. In the embodiment of FIG. 3 an OR gate is used as the logic gate. As in the previous embodiment shown in FIG. 1 a microprocessor 100 and an optional end stage 102, especially an inverting end stage with open collector with a further control device pin 103 is present, as well as an output line 104 for connection of other peripheral devices. Instead of a driver stage according to FIG. 1 the OR gate 302 is integrated in the circuit. In this embodiment another different or second RC circuit portion 301,300 with high pass properties instead of low pass properties is connected to an additional input of the OR gate 302. However in other embodiments an additional suitable signal could be fed directly to the additional input of the OR gate 302 instead of to this RC circuit portion 301, 300. Generally the OR gate 302 is triggered by the second signal with a switching pulse, whereby the input of the OR gate 302 reaches a low voltage because the capacitor, charged by the switching pulse, immediately discharges to ground through the resistor 300 after expiration of a short switching transient. In this special case the switching pulse is produced by applying a supply voltage Uv3 to the capacitor 301 and charging it. The supply voltage Uv3 is produced in the same manner as described above for Uv2 and Uv1. Because of that a short switching pulse for the OR gate 302 arises at the end of the charging process before the capacitor 301 is discharged again via the following resistor 300 to ground, so that the second input of the OR gate is at the null potential. Because of the switching pulse at the beginning the switching of the end stage 102, the high running of the supply voltage, is guaranteed. Since then the second port of the OR gate 302 is at low potential after application of the switching pulse, the end stage 102 can be directly controlled by the μC port P. The feedback of the output of the OR gate GA through a feedback element 105a necessarily occurs as in the previous example. This feedback can also occur here in the simplest case by means of a resistor. However various other circuits and/or components could conceivably be used to in place of the feedback resistor. For example, the feedback element 105a could be a reactive or a reactive and resistive element as well as a purely resistive element; it could be an RC circuit portion that forms a filter.

In the above-described embodiments, preferably with a driver component 101, the output of the microprocessor during a reset can be tristate according to the state of the art. The term "tristate" means that the μC port P can be high (weakly high, active high), low (weakly low, active low) and high impedance (output blocked). Generally only a weakly high output or a weakly low output condition for the μC port P is possible with the circuit arrangement according to the invention. Generally the state of the flip-flop or multivibrator circuit or the comparator cannot be read out as in the state of the art. This is true since the output and comparator circuits generally have different levels and the circuit thresholds are slowly reached. This is not the situation in the case of the circuitry according to the invention. In the circuitry according to the invention the state of the driver or gate output can be simply read out, because of the fact that the circuit arrangement according to the invention operates with a static or stationary level.

Besides the use of a microprocessor for control, for example, of an adjusting member or other peripheral device, which in the most general case is formed as a control unit, other controlling devices or regulating units, such as a programmable controller (SPS) or a hard-wired logic device are conceivable for use in place of the microprocessor, in additional advantageous embodiments of the circuit arrangements or chip devices according to the invention.

The principal method according to the invention can be implemented in a microprocessor or computer. This process for preventing changes of a preset state of an adjusting member or control unit, such as end stage 102, on a reset of the adjusting member or control unit by means of a signal, for example $\mu$CS at the terminal or port P, from the controller or regulator, such as the microprocessor 100, can occur in the following manner: Independently of a first signal $\mu$CS from a first circuit and/or a first component, such as the driver component 101, a second signal, e.g. the signal TrS available at TA, is formed. This second signal controls the adjusting member and/or control unit instead of the first signal because of the intervening circuit and/or component according to the invention. A third signal is generated according to the second signal, for example, by means of the feedback element 105, which, like the signal $\mu$CTrS, is fed together with the first signal in the sense of a feedback to the circuit and/or the component or a fourth signal is formed, which is fed to the circuit and/or component, e.g. the RC circuit portion 106,107 by means of a second circuit and/or a second component, for example the RC member 106,107.

The disclosure in German Patent Application 198 55 143.6–51 of Nov. 30, 1998 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a circuit means or arrangement for maintaining control of a peripheral device by a microprocessor during a reset, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

I claim:

1. A circuit arrangement comprising means for preventing a change of each of two preset states of a control member (102) during resetting of a controller (100) for setting the preset states of the control member, said means for preventing said change of each of said two preset states being connected between at least one terminal (P) of said controller (100) and at least one input of said control member (102) and including means for generating a second signal to control said control member according to a level of a first signal appearing at said at least one terminal (P) of said controller (100);

wherein said means for generating said second signal comprises a component (101, 302) for generating said second signal to control said control member, said component (101, 302) having an output for said second signal connected with said at least one input of said control member (102), and a feedback element (105, 105a) connecting said output of said component (101, 302) with said at least one terminal (P) of the controller (100) to feed back said second signal to the at least one terminal (P) of the controller (100), wherein said feedback element has sufficiently high impedance so that said change each of said two preset states may be initiated by said controller, except during said resetting of said controller.

2. The circuit arrangement as defined in claim 1, wherein said component is a driver component (101) for amplifying said first signal appearing at said at least one terminal (P) of said controller (100).

3. The circuit arrangement as defined in claim 1, wherein said component comprises logic means for logical combination of said first signal appearing at said at least one terminal (P) of said controller (100) with another signal.

4. The circuit arrangement as defined in claim 3, wherein said logic means is an OR gate.

5. A circuit arrangement for preventing a change of a preset state of a control member (102) during resetting of a controller (100) for the control member, wherein said circuit arrangement is connected between at least one terminal (P) of said controller (100) and at least one input of said control member (102) and said circuit arrangement comprises means for generating a second signal to control said control member according to a level of a first signal appearing at said at least one terminal (P) of said controller (100), wherein said means for generating said second signal comprises a component (101, 302) for generating said second signal to control said control member, said component (101, 302) having an output for said second signal connected with said at least one input of said control member (102), and a feedback element (105, 105a) connecting said output of said component (101, 302) with said at least one terminal (P) of the controller (100) to feed back said second signal to the at least one terminal (P) of the controller (100);

wherein said component comprises logic means for logical combination of said first signal appearing at said at least one terminal (P) of said controller (100) with another signal and said logic means comprises means for performing a logical OR operation and said another signal is a short pulse for combination with said first signal.

6. The circuit arrangement as defined in claim 5, wherein said means for performing said logical OR operation is an OR gate and said short pulse is a switching pulse.

7. The circuit arrangement as defined in claim 1, wherein said feedback element is a resistive element, a reactive element or a resistive and reactive element.

8. The circuit arrangement as defined in claim 1, wherein said feed back element comprises an RC circuit portion that forms a filter device.

9. The circuit arrangement as defined in claim 1, further comprising at least one pre-switching element connected to said component (101, 302) and wherein said at least one pre-switching element comprises a resistive element, a reactive element or a resistive and reactive element.

10. The circuit arrangement as defined in claim 9, wherein said resistive element is a resistor and said resistive and reactive element comprises a filter means.

11. The circuit arrangement as defined in claim 1, comprising a first energy source and said controller (100) has a second energy source and said first energy source is equal to or different from said second energy source in regard to said energy supply.

12. A circuit arrangement comprising means for preventing a change of each of two preset states of a control member during resetting of a controller for setting the preset states of the control member, said means for preventing said change being connected between at least one terminal (P) of said controller (100) and at least one input of said control member (102) and including means for generating a second signal for controlling said control member according to a level of a first signal appearing at said at least one terminal (P) of said controller, wherein said circuit arrangement comprises a driver component (101) for generating said second signal, said driver component (101) having an output for said second signal connected with said at least one input of said control member (102) and said-driver component (101) having at least one input connected to said at least one terminal (P) of said controller; an RC-circuit forming a low pass filter, said RC-circuit being connected between said at least one terminal (P) and said at least one input of said driver component (101), and a feedback resistor (105) connecting said output of said driver component (101) to said at least one terminal (P) of said controller (100), wherein said feedback element has sufficiently high impedance so that said change each of said two preset states may be initiated by said controller, except during said resetting of said controller.

13. A circuit arrangement for preventing a change of a preset state of a control member during resetting of a controller for the control member, wherein said circuit arrangement is connected between at least one terminal (P) of said controller (100) and at least one input of said control member (102) and said circuit arrangement comprises means for generating a second signal for controlling said control member according to a level of a first signal appearing at said at least one terminal (P) of said controller;

wherein said circuit arrangement comprises an OR gate (302) for generating said second signal, said OR gate having an OR output for said second signal connected with said at least one input of said control member and two OR inputs, one of said two OR inputs being connected to said at least one terminal (P) of said controller and another of said two OR inputs being connected to ground; an RC circuit forming a high pass filter, said RC circuit being connected to said another of said two OR inputs, and a feedback resistor (105a) connecting said output of said OR gate (302) to said at least one terminal (P) of said controller (100).

14. A method of preventing a change of each of two preset states of a control member during resetting of a controller or regulator for setting the preset states of the control member, said two preset states consisting of an active high state and an active low state of said control member, said method comprising the steps of:

a) supplying a first signal to at least one terminal (P) of said controller (100);

b) generating a second signal to control said control member (102) according to a level of said first signal by means of a driver stage (101);

c) feeding back said second signal through a feedback element (105) to form a third signal;

d) supplying said third signal to said at least one terminal (P) and to a low pass filter means to form a fourth signal; and e) supplying said fourth signal to said driver stage (101) together with said first signal;

whereby said change of each of said two preset states of said control member may be initiated by said controller, except during said resetting of said controller.

15. The method as defined in claim 14, wherein said feedback element (105) is a feedback resistor and said RC circuit forms a low pass filter means and comprises another resistor (106) connected between said at least one terminal (P) and said driver stage (101) and a capacitor (107) connected to ground and to a node between said another resistor (106) and said driver stage (101).

16. A method of preventing a change of a preset state of a control member during resetting of a controller or regulator controlling the control member, said method comprising the steps of:

a) supplying a first signal to at least one terminal (P) of said controller (100);

b) generating a second signal to control said control member (102) according to a level of said first signal supplied to a logical component (302) via a first input of the logical component (302), said logical component comprising an OR gate;

c) feeding back said second signal through a feedback element (105a) to form a third signal;

d) supplying said third signal to said at least one terminal (P) and to said logical component (302) together with said first signal; and e) passing a fourth signal to a second input of said logical component (302) through a high pass filter means, whereby said fourth signal acts as a switching signal.

17. The method as defined in claim 16, wherein said feedback element (105a) is a feedback resistor and said high pass filter means comprises a capacitor (301) connected to said second input of said logical component and a resistor (300) connected to ground and to a node between said capacitor (301) and said second input.

* * * * *